United States Patent
Posseme et al.

(10) Patent No.: US 10,014,386 B2
(45) Date of Patent: Jul. 3, 2018

(54) METHOD OF MANUFACTURING A TRANSISTOR

(71) Applicant: Commissariat A L'Energie Atomique et aux Energies Alternatives, Paris (FR)

(72) Inventors: Nicolas Posseme, Sassenage (FR); Christian Arvet, Bernin (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/408,571

(22) Filed: Jan. 18, 2017

(65) Prior Publication Data

US 2017/0207317 A1    Jul. 20, 2017

(30) Foreign Application Priority Data

Jan. 19, 2016 (FR) ..................... 16 50392

(51) Int. Cl.
*H01L 29/66* (2006.01)
*H01L 29/06* (2006.01)
*H01L 29/78* (2006.01)

(52) U.S. Cl.
CPC ...... *H01L 29/6653* (2013.01); *H01L 29/0649* (2013.01); *H01L 29/66636* (2013.01); *H01L 29/7838* (2013.01)

(58) Field of Classification Search
None
See application file for complete search history.

(56) References Cited

U.S. PATENT DOCUMENTS

| | | |
|---|---|---|
| 5,710,054 A | 1/1998 | Gardner et al. |
| 2007/0254421 A1 | 11/2007 | Tsai et al. |
| 2009/0068810 A1 | 3/2009 | Tsai et al. |
| 2011/0298008 A1 | 12/2011 | Greene et al. |
| 2012/0199849 A1 | 8/2012 | Tsai et al. |
| 2012/0208337 A1 | 8/2012 | Greene et al. |

(Continued)

OTHER PUBLICATIONS

French Preliminary Search Report dated Oct. 11, 2016 in French Application 16 50392, filed on Jan. 19, 2016 ( with English Translation of Categories of Cited Documents and Written Opinion).

*Primary Examiner* — Asok K Sarkar
(74) *Attorney, Agent, or Firm* — Oblon, McClelland, Maier & Neustadt, L.L.P.

(57) ABSTRACT

There is provided a method for manufacturing a transistor including a gate above an underlying layer of a semiconductor material and including at least one first flank and one second flank, a gate foot formed in the underlying layer, a peripheral portion of the underlying layer surrounding the gate foot, and spacers covering at least partially the first and second flanks so as to not cover the gate foot; the method including forming the underlying layer by partially removing the semiconductor material around the gate to form the gate foot and the peripheral portion; then forming a dielectric layer for forming spacers by a deposition to cover both the first and second flanks, the gate foot, and an upper surface of the peripheral portion; and then partially removing the dielectric layer so as to expose the upper surface and so as to not expose the first and second flanks.

16 Claims, 2 Drawing Sheets

(56) References Cited

U.S. PATENT DOCUMENTS

2015/0340465 A1* 11/2015 Harley .............. H01L 29/66636
　　　　　　　　　　　　　　　　　　　　　　438/299
2017/0207320 A1* 7/2017 Arvet ................ H01L 29/66636

* cited by examiner

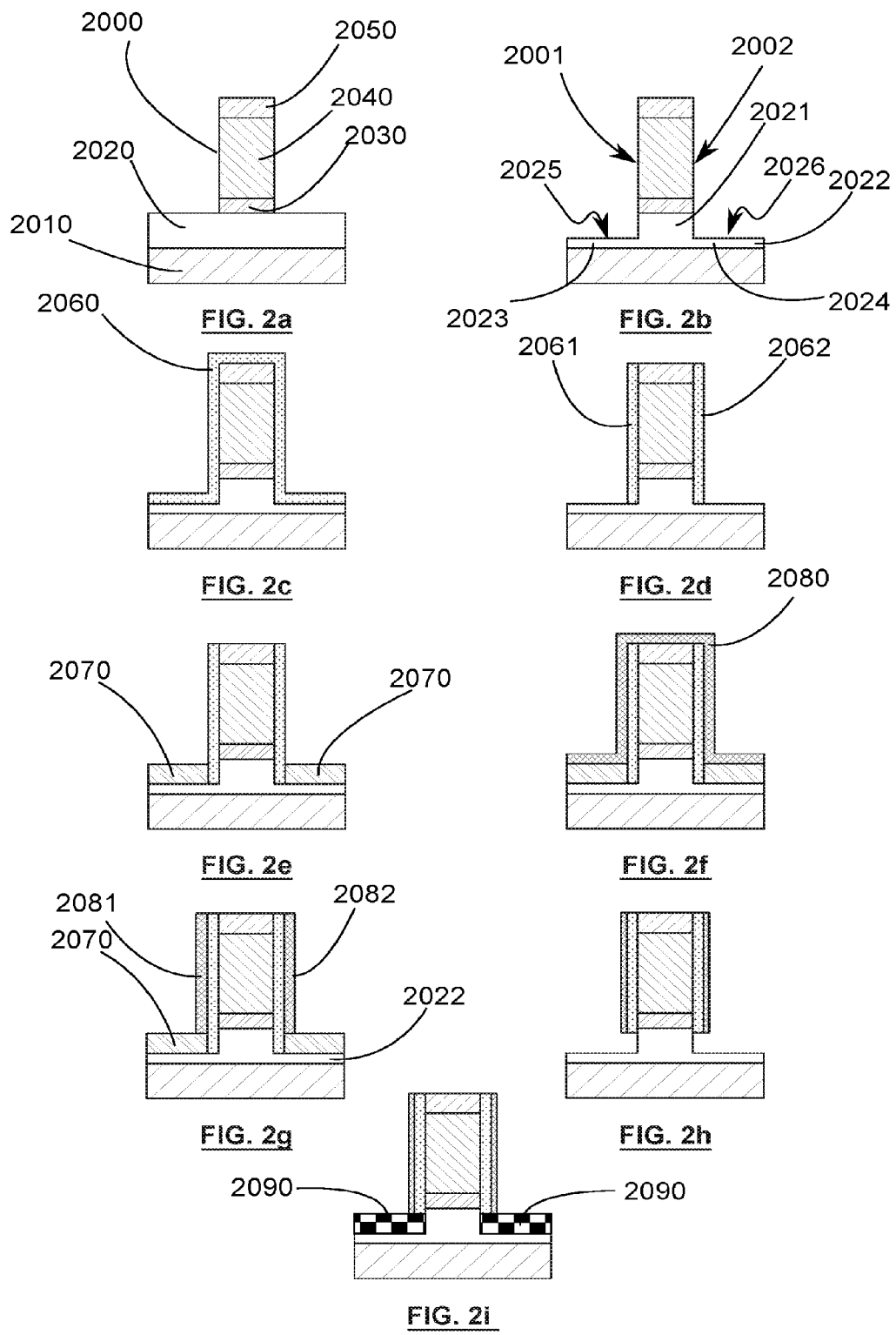

METHOD OF MANUFACTURING A TRANSISTOR

TECHNICAL FIELD OF THE INVENTION

This invention relates to transistors, particularly transistors of the MOS (Metal Oxide Semi-Conductor) type and more particularly the realization of the channel, for example, of silicon.

The microelectronics industry, which here is understood as including nanotechnology, is concerned by the invention, in the use of field effect transistors and in particular MOSFET transistors widely used in integrated circuits.

PRIOR ART

The development that the microelectronics industry has known was favored in the creation, in the 1970s, of transistors of the MOSFET type of which the source and drain electrodes are self-aligned on those of the gates which avoids a photoengraving for their defining. In particular, with gates with a polycrystalline silicon base, it is the gates themselves, made first, that are used as a mask during the doping of the source and drain zones of transistors.

This type of transistor comprises a gate, and a source and a drain globally designated as source/drain zones, since they are very generally perfectly symmetrical and can play the two roles according to the electrical polarizations that are applied to the transistor.

FIG. 1a is a cross-section view of an embodiment of a gate 1000. The gate 1000 is conventionally constituted of a stack of layers (1030, 1040, 1050) of which a large portion is always comprised of polycrystalline silicon 1040. The formation of the source and drain zone 1100, 1200 is typically carried out by ionic implantation of dopants in the zones 1100, 1200, with the gate 1000 serving as a mask as mentioned hereinabove, as such preventing the doping of the zone of the transistor in which, according to the voltages applied to the gate 1000, the conduction channel 1021 will be able to develop between source and drain.

The basic technique, very briefly described hereinabove, has been constantly perfected with the purpose of improving the electrical performance of the transistors while still making it possible to accommodate the successive reductions in the size of transistors required by an every-increasing integration of a larger number of components in an integrated circuit.

A currently used technique consists in manufacturing integrated circuits using developed substrates of the silicon on insulator type, designated by their acronym SOI. The elaborated SOI substrate is characterized by the presence of a thin original layer of monocrystalline silicon 1020 resting on a continuous insulating oxide layer 1010 in particular made of silicon, referred to as buried oxide or the acronym BOX for "buried oxide layer". The solidity and the mechanical rigidity of the whole are provided by a layer that forms the body of the SOI substrate, often qualified as "bulk" in order to indicate that the starting substrate is very generally made from solid silicon. This structure offers many advantages for the realization of MOSFET transistors. With regards to the invention, retain only that the original layer 1020 for example made of monocrystalline silicon can be controlled precisely in thickness and in doping. In particular, it is advantageous for the performance of transistors that the channel 1021 can be fully devoid of carriers, i.e. "fully depleted" (FD), which is generally used to designate this state. This is obtained by carrying out the transistors using SOI substrates of which the original layer 1020 is very thin. This type of transistor is as such designated by the acronym FDSOI.

A perfecting of the basic technique of self-alignment which has been universally adopted consists in the formation of spacers 1061, 1062 on the flanks of the gate 1000. In order to be able to maintain low electrical resistances for access to the source and drain electrodes, despite the reduction in size of transistors, it was then necessary to increase their section. This is obtained by selective epitaxy of the source/drain zones 1100, 1200. During this operation the original initial layer 1020 of monocrystalline silicon will be increased locally. It is then necessary to protect the gate zones in order to prevent the growth from occurring also from the polycrystalline silicon 1040 of the gate. It is, among other things, the role of the spacers to provide this function. They also provide a role of preserving the gate during the silicifying of the contacts (not shown) which is then carried out with the same purpose in order to decrease the serial resistance access to the electrodes of the transistor.

The formation of spacers 1061, 1062 has become a crucial step in the formation of transistors which now reach dimensions that are commonly measured in nanometers (nm=$10^{-9}$ meters) and which are globally of decananometric sizes. The realization of the spacers 1061, 1062 is carried out in this technology without calling into play any photoengraving operation.

In order to achieve this, FIG. 1b shows the formation of a first nitride layer 1060, in particular of silicon nitride (SiN). This layer is then subjected, in the step of FIG. 1c, to a highly anisotropic etching in such a way that the etching suppresses the portions of the layer 1060 located on the original layer 1020 (which are generally horizontal, i.e. directed perpendicularly to the thickness of the substrate) while still preserving, at least partially, the nitride on the non-horizontal portions and particularly on the portions that form the flanks of the gate 1000.

FIG. 1d shows the following step aiming to reduce the dimensions of the silicon channel in such a way as to arrange the source/drain zones as close as possible to the channel 1021. This reduction in physical dimensions is commonly carried out by a chemical or inductively-coupled plasma isotropic etching by using SF6 base chemistry for example. This step, well known to those skilled in the art, allows for an isotropic etching of the original layer 1020. The etching is therefore carried out identically, both vertically and horizontally. The precise control of the sizing of the silicon channel 1021 is then problematic.

This invention makes it possible to respond to at least one portion of the disadvantages of the current techniques by providing an ingenious method for sizing the silicon channel.

SUMMARY OF THE INVENTION

An aspect of this invention relates to a method of manufacturing a transistor comprising:
 a gate located above an underlying layer of a semiconductor material, said gate comprising at least one first and one second flank,
 a gate foot formed under the gate and protruding in said underlying layer relatively to a peripheral portion of the underlying layer surrounding the gate foot, with the method comprising a step of formation of a dielectric layer in such a way as to form spacers that cover at least partially said first and second flanks of the gate in such a way as to not cover at least partially said gate foot, Advantageously, before the step of formation of the dielectric layer, the underlying layer is formed with a step of partial removal of the semi-conductor material in an original layer of the semi-conductor material, around the gate in such a way as to form said gate foot, and to form the peripheral portion surrounding the gate foot.

Preferably, the step of formation of the dielectric layer comprises at least one conformal deposition in order to receive said first and second flanks of the gate, said gate foot and said peripheral portion.

Advantageously, the step of formation of the dielectric layer is followed by a step of partial removal of the dielectric layer in such a way as to expose an upper surface of the peripheral portion of the underlying layer, and in such a way as to not expose said first and second flanks of the gate and said gate foot.

This method as such makes it possible to form a gate foot of which the physical parameters are precisely controlled in such a way as to define with precision the channel of the transistor. The dopants can as such be brought as close as possible to the silicon channel.

This method then allows for a reduction in the width of the channel that separates the source and the drain of the transistor.

Another aspect of this invention relates to a microelectronic device provided with at least one transistor comprising a gate with a gate foot, more preferably straight, of width less than or equal to the width of the gate and of the spacers.

BRIEF DESCRIPTION OF THE FIGURES

The purposes and objects as well as the characteristics and advantages of the invention shall appear better in the detailed description of an embodiment of the latter which is shown by the following accompanying drawings wherein:

FIGS. 2a to 2i show steps according to an embodiment of the invention.

Figure 1A:
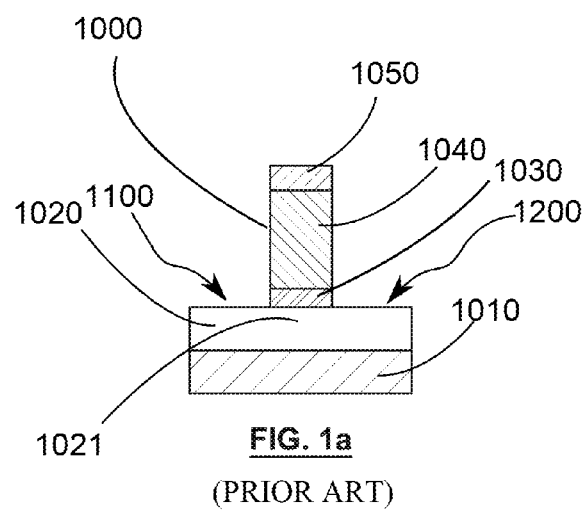
FIGS. 1a to 1d show successive conventional phases of the realization of an isotropic etching of the underlying layer of silicon.
Figure 1B:
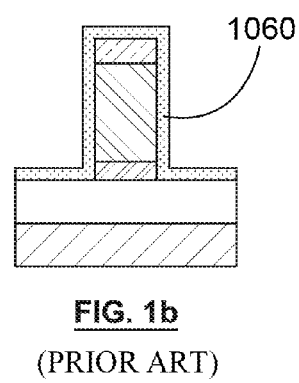
Figure 1C:
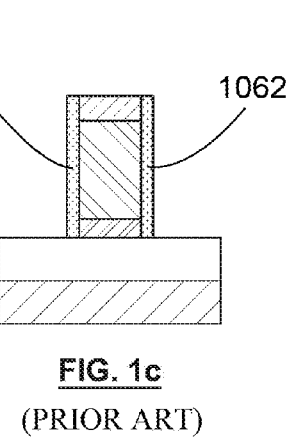
Figure 1D:
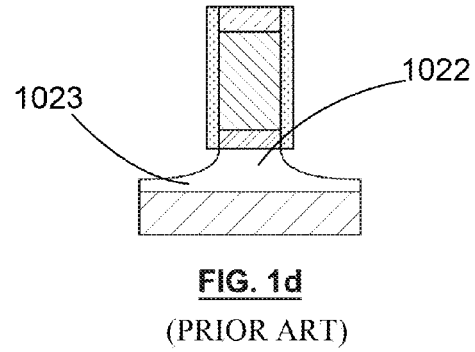

The attached drawings are given by way of examples and do not limit the invention. These drawings are diagrammatical representations and are not necessarily to the scale of the practical application. In particular, the relative thicknesses of the layers and of the substrates do not represent reality.

DETAILED DESCRIPTION OF THE INVENTION

It is specified that in the framework of this invention, the term "on", "overmounts" or "underlying" or their equivalent does not necessarily mean "in contact with". As such for example, the deposition of a first layer on a second layer, does not necessarily mean that the two layers are directly in contact with one another but this means that the first layer covers at least partially the second layer by being, either directly in contact with it, or by being separated from it by another layer or another element.

In the description that follows, the thicknesses are generally measured according to directions perpendicular to the plane of the lower face of the layer to be etched or of a substrate whereon the lower layer is arranged. As such, the thicknesses are generally taken according to a vertical direction in the figures shown. On the other hand, the thickness of a layer covering a flank of a pattern is taken according to a direction perpendicular to this flank.

In what follows, the term selective etching means the removal via etching of a given material by preserving at least partially, via the selectivity of the method used, other materials.

The term "surface layer" corresponds to a layer that is formed, in particular by modification of the underlying layer or by a deposition on this underlying layer, on the surface of the electronic device after the formation of the underlying layer. It is then partially removed in order to partially remove the underlying layer. The adjective "surface" does not necessarily mean that the residual surface layer always remains on the surface of the device when the manufacture of the latter is finalized. It can be for example removed or covered.

The term "conformal" means a layer geometry that has the same thickness, to the nearest manufacturing tolerances, an identical thickness despite the changes in the direction of the layer, for example on the gate pattern flanks.

The word "dielectric" corresponds to a material of which the electrical conductivity is sufficiently low in the given application to serve as insulation.

In order to begin a detailed review of embodiments of the invention, listed hereinafter are optional characteristics that can possibly be used in association or alternatively:

Advantageously, the dielectric layer forms spacers. The spacers formed as such allow for the realization of the transistor without covering the gate foot constituting the silicon channel.

Advantageously, the step of partial removal of the original layer is configured to form a straight gate flank according to a dimension in thickness of the original layer.

Advantageously, the step of partial removal of the original layer comprises an anisotropic etching configured to attack only the portions of the original layer directed according to a dimension in thickness of said layer.

This makes it possible to carry out an anisotropic etching and therefore to etch the layer under consideration only according to a preferential direction, that of the thickness.

Advantageously, the step of partial removal of the underlying layer is carried out by dry etching.

This makes it possible to carry out an anisotropic etching and therefore to etch the layer under consideration only according to a preferential direction, that of the thickness.

Advantageously, the width of the gate is greater than or equal to the width of the gate foot.

This makes it possible to decrease the section of the silicon channel on the source and the drain.

Advantageously, the formation of the dielectric layer is carried out by PECVD.

Advantageously, the at least one peripheral portion of the underlying layer has a thickness preferentially greater than or equal to 3 nm.

It is advantageous to retain at least 3 nm of this peripheral portion of the underlying layer in order to allow for the following integration steps.

Advantageously, the underlying layer comprises a semi-conductor material such as Silicon (Si).

This enables the method to be suitable with the existing technologies.

Advantageously, the layer of semi-conductor material has a thickness preferentially greater than 5 nm and for example between 8 nm and 15 nm, advantageously between 9 nm and 12 nm, and preferably equal to 10 nm. This thickness can be much greater.

Advantageously, the underlying layer has a thickness of at least 3 nm.

Advantageously, the gate foot has a height preferentially between 8 nm and 12 nm, advantageously between 9 nm and 12 nm, and preferably equal to 10 nm.

Advantageously, the gate has a height preferentially between 30 nm and 100 nm, advantageously between 40 nm and 70 nm, and preferably equal to 50 nm.

Advantageously, the gate foot has a width preferentially equal to that of the gate and/or for example between 5 nm and 50 nm, advantageously between 15 nm and 30 nm, and preferably equal to 20 nm.

Advantageously, the gate has a width preferentially between 5 nm and 50 nm, advantageously between 15 nm and 30 nm, and preferably equal to 20 nm.

Advantageously, the width of the gate is greater than the width of the gate foot.

Advantageously, the width of the gate is equal to the width of the gate foot.

Advantageously, the formation of the dielectric layer comprises at least one conformal deposition.

This makes it possible to cover all of the surfaces with the same thickness of material and as such to be able to control the steps of partial removal of the layer identically over all of the surfaces.

Advantageously, the dielectric layer comprises at least one material taken from: silicon nitride (SiN), boron nitride (BN), any type of material of which the dielectric conductivity is less than or equal to 7.

This allows for the use of materials that are usually used for the formation of spacers.

Advantageously, the dielectric layer has a thickness preferentially between 0.5 nm and 6 nm, advantageously between 1 nm and 3 nm and preferably equal to 2 nm.

Advantageously, the gate spacers cover said gate foot over a covering height that is preferentially zero, or for example between 0 nm and three-quarters of the height of the gate foot, advantageously between 0 nm and half of the height of the gate foot, and preferably equal to 0 nm.

Advantageously, the step of removal of the underlying layer is carried out by at least one technique taken from at least: dry etching by carbon fluorine plasma, such as CxFy, CxFyHz.

This makes it possible to carry out an anisotropic etching and therefore to etch the layer under consideration only according to a preferential direction, that of the thickness.

Advantageously, the step of formation of the dielectric layer is followed by a step of partial removal of the dielectric layer on an upper surface of the peripheral portion of the underlying layer.

This makes it possible to remove the dielectric layer serving as a spacer of the zones surrounding the gate and preferentially peripheral portions of the underlying layer.

Advantageously, said partial removal of the dielectric layer is carried out in such a way as to leave the at least first and second flanks of the gate covered with the dielectric layer in such a way as to form said spacers.

This allows for the formation of a portion at least of the spacers of the transistor.

Advantageously, the step of partial removal of the dielectric layer is carried out by dry etching.

This makes it possible to carry out an anisotropic etching and therefore to etch the layer under consideration only according to a preferential direction, that of the thickness.

Advantageously, the step of partial removal of the dielectric layer is carried out by dry etching by carbon fluorine plasma.

This makes it possible to carry out an anisotropic etching and therefore to etch the layer under consideration only according to a preferential direction, that of the thickness.

Advantageously, the step of partial removal of the dielectric layer is carried out: by dry etching by carbon fluorine plasma with a CxFy or CxHyFz base.

This makes it possible to carry out an anisotropic etching and therefore to etch the layer under consideration only according to a preferential direction, that of the thickness.

Advantageously, the step of partial removal of the dielectric layer comprises a prior step of surface oxidation of the dielectric layer.

This makes it possible to obtain better control of the sizing of the spacers during the etching.

Advantageously, the step of partial removal of the dielectric layer is followed by a step of formation of a surface layer on the peripheral portion of the underlying layer.

This allows for the formation of a surface layer used in the rest of the steps. The growth method as well as the materials are advantageously those used for the formation of the source and of the drain.

Advantageously, the formation of the surface layer is carried out by epitaxy.

The growth method as well as the materials are advantageously those used for the formation of the source and of the drain. This then makes it possible to use a method and materials that are already present in the methods that are usually used.

Advantageously, the surface layer has a thickness at least equal to said height of the gate foot.

This makes it possible to protect the flanks of the gate foot during the following steps.

Advantageously, the surface layer comprises a material for example with a Germanium base such as SiGe with a concentration of Ge varying from 20% to 80% more preferably 30%.

The growth method as well as the materials are advantageously those used for the formation of the source and of the drain. This then makes it possible to use a method and materials that are already present in the methods that are usually used.

Advantageously, the step of formation of the surface layer is carried out by epitaxy.

The growth method as well as the materials are advantageously those used for the formation of the source and of the drain. This then makes it possible to use a method and materials that are already present in the methods that are usually used.

Advantageously, the step of formation of the surface layer is preceded by a step of cleaning of the upper surface of the peripheral portion of the underlying layer surrounding the gate by a wet solution.

This makes it possible to prepare the surface in order to allow for the epitaxy of the surface layer.

Advantageously, the wet solution is a solution with a hydrofluoric acid base.

Advantageously, the surface layer has a thickness preferentially at least equal to the height of the gate foot, and for example at least equal to the thickness of the original layer less at least 3 nm.

Advantageously, the step of formation of said surface layer is followed by a step of formation of a selectivity layer in such a way as to cover at least a portion of the gate, at least a portion of the dielectric layer and at least a portion of the surface layer.

This makes it possible to protect the spacers for the rest of the steps in order to retain at least a portion of the spacers at the end of the method.

Advantageously, said selectivity layer is chemically identical to the dielectric layer.

This makes it possible to form additional spacers.

Advantageously, the step of formation of said surface layer is followed by a step of formation of a selectivity layer in such a way as to cover at least a portion of the gate.

This makes it possible to protect the spacers for the rest of the steps in order to retain at least a portion of the spacers at the end of the method.

Advantageously, the step of formation of said surface layer is followed by a step of formation of a selectivity layer in such a way as to cover at least a portion of the dielectric layer.

This makes it possible to protect the spacers for the rest of the steps in order to retain at least a portion of the spacers at the end of the method.

Advantageously, the step of formation of said surface layer is followed by a step of formation of a selectivity layer in such a way as to cover at least a portion of the surface layer.

Advantageously, the step of formation of the selectivity layer is carried out by PECVD.

Advantageously, said selectivity layer comprises at least one material taken from at least: silicon nitride (SiN), boron nitride (BN), any type of material of which the dielectric conductivity is less than or equal to 7.

This allows for the use of materials that are usually used for the formation of spacers.

Advantageously, said selectivity layer is a kinetic selectivity layer.

This makes it possible to remove the selectivity layer at the same speed as the dielectric layer, only the relative thickness of the two layers allows for the selection of the portion of the layer remaining at the end of the step of removal.

Advantageously, said selectivity layer is chemically different from the dielectric layer.

This makes it possible to form additional spacers that can include different materials with respect to the spacers carried out previously.

Advantageously, said selectivity layer is a chemical selectivity layer.

This makes it possible to use removal methods that are specific to other layers in such a way as to not modify this layer and as such protect the layer covered with this so-called chemical selectivity layer.

Advantageously, said selectivity layer has a thickness preferentially between 1 nm and 15 nm, advantageously between 2 nm and 10 nm and preferably equal to 3 nm.

Advantageously, said selectivity layer has a thickness greater than or equal to the thickness of said dielectric layer.

This allows for a control of the quantity of material removed during the step of removal of the dielectric layer.

Advantageously, the step of formation of the selectivity layer is followed by a step of partial removal of said selectivity layer on the upper surface of the peripheral portion of the underlying layer.

This allows for the removal of the selectivity layer on the surface layer in order to be able to remove the latter in the following steps.

Advantageously, said partial removal of the selectivity layer is carried out in such a way as to leave the at least one first and second flanks of the gate covered with the selectivity layer in such a way as to form said additional spacers.

This makes it possible to form additional spacers.

Advantageously, said one residual portion of the selectivity layer forms additional spacers.

This makes it possible to form additional spacers.

Advantageously, the step of partial removal of the selectivity layer is carried out by dry etching.

This makes it possible to carry out an anisotropic etching and therefore to etch the layer under consideration only according to a preferential direction, that of the thickness.

Advantageously, the step of partial removal of the selectivity layer is carried out by dry etching by carbon fluorine plasma.

This makes it possible to carry out an anisotropic etching and therefore to etch the layer under consideration only according to a preferential direction, that of the thickness.

Advantageously, the step of partial removal of the selectivity layer is carried out by fluorine chemical plasma dry etching with a $C_xF_y$ or $C_xH_yF_z$ base.

This makes it possible to carry out an anisotropic etching and therefore to etch the layer under consideration only according to a preferential direction, that of the thickness.

Advantageously, the partial removal of the selectivity layer leaves a portion at least of the at least one first and second flank of the gate covered with said selectivity layer.

This makes it possible to form additional spacers.

Advantageously, the step of partial removal of the selectivity layer is followed by a step of removal at least partially of the surface layer.

This makes it possible to clear the flanks from the gate foot and to release the peripheral portion from the underlying layer for the future formation of the source and of the drain.

Advantageously, the step of partial removal of the selectivity layer is followed by a step of removal of the surface layer according to at least one portion of its thickness.

This makes it possible to clear the flanks from the gate foot and to release the peripheral portion from the underlying layer for the future formation of the source and of the drain.

Advantageously, the step of at least partial removal of the surface layer is followed by a step of removal at least partially of said dielectric layer in such a way as to uncover the gate foot without uncovering at least partially the at least one first and second flanks of the gate.

This makes it possible to clear the flanks from the gate foot in order to then realize the source and the drain in such a way that the dopants are as close as possible to the silicon channel.

Advantageously, the step of at least partial removal of said dielectric layer is carried out by a wet etching.

This allows for an isotropic etching and as such to reduce the thickness of the additional spacers.

Advantageously, the step of at least partial removal of the surface layer is carried out by wet etching or dry etching.

This makes it possible to adapt the etching technique according to the situations and the materials at play.

Advantageously, the step of removal of said dielectric layer is carried out by at least one technique taken from at least: wet etching or dry etching.

This makes it possible to adapt the etching technique according to the situations and the materials at play.

Advantageously, the step of removal of said dielectric layer is carried out by a chemical wet etching with a hydrofluoric acid base.

This allows for an isotropic etching and as such to reduce the thickness of the additional spacers.

This invention relates to a method for manufacturing a transistor comprising:
- a gate 2000 located above an underlying layer 2022 of a semi-conductor material, said gate 2000 comprising at least one first and one second flank 2001 and 2002,
- a gate foot 2021 formed under the gate 2000 and protruding in said underlying layer 2022 relatively to a peripheral portion (2023, 2024) of the underlying layer 2022 surrounding the gate foot 2021.

The term "height of the gate foot 2021" here means the height of the portion protruding relatively to the peripheral portion (2023, 2024) of the underlying layer 2022.

According to an embodiment, the method according to this invention comprises at least one step of formation of the underlying layer 2022 with a step of partial removal of the semi-conductor material in an original layer 2020 of the semi-conductor material, around the gate 2000 in such a way as to form said gate foot 2021, and to form the peripheral portion (2023, 2024) surrounding the gate foot 2021.

Advantageously, the step of formation of the underlying layer 2022 is carried out before a step of formation of a dielectric layer 2060 used for the formation of the spacers 2061 and 2062 arranged on the at least first and second flanks 2001 and 2002 of the gate 2000.

Preferably, this method makes it possible to form a gate foot 2021 of which the physical parameters are precisely controlled in such a way as to define with precision the channel of the transistor. This then makes it possible, during the formation of the source and of the drain, to bring the latter as close as possible to the channel.

According to a preferred embodiment, the gate 2000 is formed by a technique known to those skilled in the art such as for example by plasma.

The gate comprises various layers 2030, 2040, and 2050:

The layer 2030 is a layer comprising a pair of materials comprising at least one material of high dielectric permittivity referred to as High-k (for example HfO2, HfSiON . . . ) and at least one metal (for example TiN). The High-k material is advantageously a material with a high dielectric permittivity, typically greater than 15. The thickness of this layer 2030 is preferentially between 2 nm and 20 nm, advantageously between 5 nm and 8 nm, and preferably equal to 7 nm.

The layer 2040 is preferentially made of polycrystalline silicon. The thickness of this layer 2040 is preferentially between 30 nm and 90 nm, advantageously between 40 nm and 70 nm, and preferably equal to 50 nm.

The layer 2050 is a hard mask, preferably made of silicon oxide. The thickness of this layer 2050 is preferentially between 10 nm and 60 nm, advantageously between 20 nm and 40 nm, and preferably equal to 30 nm.

In order to form the gate 2000, shown in FIG. 2a, a first etching using the hard mask 2050 is carried out, for example with carbon fluorine chemistry and/or with a chlorine base, in order to etch the layer 2040. This etching stops on the layer 2030. The etching of the layer 2030 is advantageously carried out by BCl3 base chemistry for example non-limiting.

For example in order to form the gate 2000, the following conditions can be used: etching of the polycrystalline silicon: HBr/O2/Ar, TiN etching: Cl2/CH4, etching of the material with a high dielectric constant: BCl3/Ar.

According to a preferred embodiment shown in FIG. 2b, the original layer 2020 is then etched in order to form the underlying layer 2022 comprising the gate foot 2021 and a peripheral portion (2023 and 2024) of the underlying layer surrounding the gate 2000. This etching is preferentially carried out with carbon fluorine chemistry and/or with a chlorine base.

Advantageously, the step of partial removal of the original layer 2020 is configured to form a straight gate flank 2000 according to a dimension in thickness of the original layer 2020.

Preferentially, the step of partial removal of the original layer 2020 comprises an anisotropic etching configured to attack only the portions of the original layer 2020 directed according to a dimension in thickness of said layer.

Advantageously, the peripheral portion (2023 and 2024) of the underlying layer surrounding the gate 2000 has a thickness between 1 nm and 6 nm, advantageously between 2 nm and 5 nm and more preferably at least equal to 3 nm. This thickness is advantageously optimized in order to allow for the realization of the following steps of integration required for the realization of the transistor.

Ingeniously, the two preceding etchings, i.e. the etching of the gate 2000 and the etching of the original layer 2020, are carried out in the same inductive coupling plasma reactor. This allows time to be saved but also an increase in safety concerning the possible contamination of a sample during the transport thereof from one reactor to another.

Advantageously, the width of the gate 2000 is greater than or equal to the width of the gate foot 2021.

The formation of the gate 2000 and the formation of the underlying layer 2022 is preferentially followed by a step of deposition of a dielectric layer 2060 shown in FIG. 2c. This step is preferentially carried out by at least one deposition of a material in such a way as to form a dielectric layer 2060 on and/or around the gate 2000. Advantageously, this deposition is conformal in such a way as to cover the flanks 2001 and 2002 of the gate 2000 with the dielectric layer 2060.

The dielectric layer 2060 advantageously comprises at least one material taken from: silicon nitride, boron nitride, all types of materials of which the dielectric constant is advantageously less than 7.

The thickness of the dielectric layer 2060 is more preferably between 0.5 nm and 4 nm, advantageously between 1 nm and 3 nm and preferably equal to 2 nm.

The deposition of the dielectric layer 2060 is for example carried out by PECVD.

The following step shown in FIG. 2d relates to the partial removal of the dielectric layer 2060 in order to form spacers 2061 and 2062 of the gate 2000. This partial removal can be for example carried out by dry etching.

This etching is more preferably carried out on an upper surface (2025, 2026) of the peripheral portion (2023, 2024) of the underlying layer. As shown in FIG. 2*d*, this upper surface (2025, 2026) corresponding to the exposed surface of the side where the gate 2000 is located.

The etching of the dielectric layer 2060 is advantageously carried out by plasma in an inductive and/or capacitive coupling reactor. The method of etching is according to the materials under consideration that comprise the dielectric layer 2060. Advantageously, this step of etching is carried out by a carbon fluorine chemical etching.

Preferentially, a preliminary step of oxidation of the dielectric layer 2060 can be carried out in order to obtain better control of the sizing of the spacers during the etching. For example, the nitride on the surface can be oxidized and as such allow for better control of the etching. Indeed, the chemistry used for example can be oxide selective, the ionic bombardment of plasma then consumes the oxide nitride on the planar portions, while the oxide is still retained on the flanks. This technique thus makes possible an anisotropic etching.

This step of partial removal is preferentially carried out in such a way as to leave the at least first and second flanks 2001 and 2002 of the gate 2000 covered with the dielectric layer 2060 in order to form the spacers 2061 and 2062.

Advantageously, this etching is configured to retain the dimensional of the spacers 2061 and 2062 as well as a stopping of the etching on the underlying layer 2022. In order to control this etching and prevent the consumption of the underlying layer 2022, the selectivity is preferentially between 10 and 60, advantageously between 15 and 45 and preferably equal to 30.

The chemistry that can be used for this etching is a chemistry with a CH3F/He/O2 base for example.

As such, by way of an example for the purposes of illustration, in order to etch 2 nm of SiN, the following etching parameters are possible: CH3F 200 sccm (cubic centimeters per minute)/O2 200 sccm/He 100 sccm/He—CH4 20 sccm with an etching speed of about 32 nm/minutes and a selectivity of about 30 with respect to the underlying layer 2022.

Advantageously, the method of this invention then comprises a step of formation of a surface layer 2070 on the peripheral portion (2023, 2024) of the underlying layer 2022 shown in FIG. 2*e*. Preferentially, the formation of this surface layer 2070 is carried out on the peripheral portion (2023, 2024) of the underlying layer surrounding the gate 2000. Advantageously, this surface layer 2070 is comprised of materials that can be used for the formation of the source/drain zones of the transistor as shall be shown in FIG. 2*i* hereinafter.

As a non-limiting example, this surface layer 2070 comprises silicon-germanium, more particularly Si70Ge30 for example. But generally this surface layer 2070 can include a material with a Germanium base.

Preferably, this surface layer 2070 is carried out by at least one technique of epitaxial growth. The thickness of the surface layer 2070 is preferentially at least equal to the height of the gate foot 2021, and for example at least equal to the thickness of the original layer 2020 less 3 nm.

Preferably, the surface layer 2070 has a thickness at least equal to said height of the gate foot 2021.

Advantageously, a step of cleaning of the upper surface (2025, 2026) of the peripheral portion (2023 and 2024) of the underlying layer 2022 surrounding the gate 2000 can be carried out by a wet solution for example, typically with a hydrofluoric acid base (for example HF at 0.5% for about 10 seconds), before the step of formation of the surface layer 2070.

According to a preferred embodiment shown in FIG. 2*f*, the following step comprises the formation of a selectivity layer 2080 in such a way as to cover at least a portion of the gate 2000, at least a portion of the dielectric layer 2060 and at least a portion of the surface layer 2070. This then makes it possible to protect the spacers 2061 and 2062 of the gate 2000 during the following steps of this method.

Preferably, the selectivity layer 2080 is chemically identical to the dielectric layer 2060 in order to form afterwards additional spacers 2081 and 2082 of the same chemical nature as the spacers 2061 and 2062 of the gate 2000.

According to an embodiment, the formation of the selectivity layer 2080 is carried out by a deposition of a material taken from at least: silicon nitride, boron nitride, any type of material of which the dielectric constant is advantageously less than 7.

The deposition of the selectivity layer 2080 is for example carried out by PECVD.

Advantageously, this deposition is conformal, and the selectivity layer 2080 has a thickness between 2 nm and 29 nm, preferentially between 6 nm and 15 nm, and advantageously equal to 8 nm.

According to an embodiment shown in FIG. 2*g*, the following step correspond to a partial removal of the selectivity layer 2080 on an upper surface (2025, 2026) of the peripheral portion (2023 and 2024) of the underlying layer 2022.

Advantageously, this step of partial removal is carried out in such a way as to leave the at least one first and second flanks 2001 and 2002 of the gate 2000 covered with the selectivity layer 2080 in such a way as to form additional spacers 2081 and 2082 covering at least partially the spacers 2061 and 2062. As such a residual portion of the selectivity layer 2080 forms additional spacers 2081 and 2082.

Preferably, the partial removal of the selectivity layer 2080 is carried out by dry etching. This etching is configured to stop on the surface layer 2070. The selectivity of this etching in relation to the surface layer 2070 is more preferably between 10 and 50, advantageously between 15 and 40 and preferably equal to 30. This parameter makes it possible to minimize the consumption of the surface layer 2070.

The chemistry that can be used for this etching is a chemistry with a CH3F/He/O2 base for example.

For example non-limiting, this etching can be carried out with the following parameters: CH3F 200 sccm/O2 200 sccm/He 100 sccm/He—CH4 20 sccm.

According to an advantageous embodiment, the step of partial removal of the selectivity layer 2080 is followed by a step of removal at least partially of the surface layer 2070 shown in FIG. 2*h*.

This etching can be carried out by wet method with a hydrofluoric acid and acetic acid base for example.

According to an embodiment, the etching speed is preferentially between 50 nm/minutes and 70 nm/minutes, advantageously between 55 nm/minutes and 65 nm/minutes and preferably equal to 58 nm/minutes.

The selectivity of this etching is preferentially between 40 and 60, preferentially entre 45 and 55 and advantageously equal to 50 with respect to the selectivity layer 2080 and/or the original layer 2020.

This etching can also be carried out by dry method, with for example a selectivity between 20 and 80, advantageously between 40 and 70, and more preferably between 50 and 60 according to the materials under consideration.

For example, the SiGe/Si selectivity is about 60. This is required in order to retain the integrity of the underlying layer of which the thickness is advantageously of a few nanometers in order to continue with the formation of the sources and of the drains with epitaxial growth for example.

For example, the SiGe/SiN selectivity is about 20.

The chemistry that can be used for this etching is a chemistry with a CF4/N2/Ar base for example.

An as non-limiting example, the etching by dry method can be carried out as follows: In order to remove 8 nm of SiGe, the etching is carried out in etching equipment of the Down Stream type (downstream of the plasma) with a delocalized microwave source of 2.45 GHz, the etching species are conveyed into a wave guide in the torching chamber according to the following conditions: 700 w, 300 mTr, CF4 500 sccm, N2 50 sccm, Ar 500 sccm, 25° C. and for an etching time of about 8 seconds.

According to an embodiment also shown in FIG. 2h, the following step corresponds to a step of removal at least partially of the dielectric layer 2060 in such a way as to uncover the gate foot 2021 without uncovering at least partially the at least one first and second flanks 2001 and 2002 of the gate 2000 in such a way as to retain the spacers 2061 and 2062 as well as the additional spacers 2081 and 2082.

Advantageously, this step is carried out by wet etching, for example by a chemistry with a hydrofluoric acid base for etching silicon nitride.

As such, the dielectric layer 2060 located on the flanks of the gate foot 2021 is consumed in order to uncover said flanks of the gate foot 2021.

According to a preferred embodiment, the step of at least partial removal of the surface layer 2070 shown in FIG. 2h is followed by a step of formation of Source/Drain zones 2090 shown in FIG. 2i. For example non-limiting, the formation of the Source/Drain zones 2090 can be carried out by epitaxial growth and/or ionic implantation.

In this figure, and in accordance with the technical characteristics of this invention, the Source/Drain zones 2090 have at least one portion located under the additional spacers 2081 and 2082, and more preferably under the spacers 2061 and 2062.

Advantageously, the Source/Drain zones 2090 are as close as possible to the gate foot 2021, and more preferably in contact with the gate foot 2021.

According to the embodiment shown in FIG. 2i, the gate foot 2021 comprises at least partially the conduction channel between the Source/Drain zones 2090.

The invention is not limited to the embodiments described hereinabove and extends to all the embodiments covered by the claims.

The invention claimed is:

1. A method for manufacturing a transistor,
the transistor comprising:
a gate disposed above an underlying layer of a semiconductor material, and comprising at least one first flank and one second flank,
a gate foot formed in the underlying layer under the gate and protruding relative to an upper surface of a peripheral portion of the underlying layer, the peripheral portion of the underlying layer surrounding the gate foot, and
spacers at least partially covering the at least one first flank and the one second flank of the gate so as to not cover at least partially said gate foot; and the method comprising:
forming of the underlying layer comprising a partial removal of the semiconductor material in an original layer of the semiconductor material, around the gate so as to form said gate foot, and to form the peripheral portion, followed by
forming of a dielectric layer to form the spacers, the forming of the dielectric layer comprising at least one deposition configured to cover both the at least one first flank and the one second flank of the gate, cover the gate foot, and cover the upper surface of the peripheral portion, and then
partially removing the dielectric layer so as to expose the upper surface of the peripheral portion, and so as to not expose the at least one first flank and the one second flank of the gate and so as to not expose the gate foot.

2. The method according to claim 1, wherein the partial removal of the semiconductor material in the original layer is configured to form a straight gate flank according to a dimension in a thickness direction of the original layer.

3. The method according to claim 1, wherein the partial removal of the semiconductor material in the original layer comprises an anisotropic etching configured to attack only portions of the original layer directed according to a dimension in a thickness direction of the original layer.

4. The method according to claim 1, wherein a width of the gate is greater than or equal to a width of the gate foot.

5. The method according to claim 1, wherein the partial removal of the dielectric layer is carried out by dry etching.

6. The method according to claim 1, wherein the partial removal of the dielectric layer is followed by a formation of a surface layer on the peripheral portion.

7. The method according to claim 6, wherein the formation of the surface layer is carried out by epitaxy.

8. The method according to claim 6, wherein the surface layer has a thickness at least equal to a height of the gate foot.

9. The method according to claim 6, wherein the formation of the surface layer is followed by a formation of a selectivity layer so as to cover at least a portion of the gate, at least a portion of the dielectric layer, and at least a portion of the surface layer.

10. The method according to claim 9, wherein said selectivity layer is chemically identical to the dielectric layer.

11. The method according to claim 9, wherein the formation of the selectivity layer is followed by a partial removal of the selectivity layer on the upper surface of the peripheral portion.

12. The method according to claim 11, wherein the partial removal of the selectivity layer is carried out so as to leave the at least one first flank and the one second flank of the gate covered by the selectivity layer so as to form additional spacers.

13. The method according to claim 11, wherein the partial removal of the selectivity layer is carried out by dry etching.

14. The method according to claim 11, wherein the partial removal of the selectivity layer is followed by an at least partial removal of the surface layer.

15. The method according to claim 14, wherein the at least partial removal of the surface layer is followed by an at least partial removal of the dielectric layer so as to uncover the gate foot without uncovering at least partially the at least one first flank and the one second flank of the gate.

16. The method according to claim 15, wherein the at least partial removal of the dielectric layer is carried out by wet etching.

* * * * *